(12) United States Patent
Akiyama et al.

(10) Patent No.: US 6,848,035 B2
(45) Date of Patent: Jan. 25, 2005

(54) SEMICONDUCTOR DEVICE WITH MULTI-BANK DRAM AND CACHE MEMORY

(75) Inventors: Satoru Akiyama, Kokubunji (JP); Yusuke Kanno, Hachioji (JP); Takao Watanabe, Fuchu (JP)

(73) Assignee: Renesas Technology Corp., Tokyo (JP)

( * ) Notice: Subject to any disclaimer, the term of this patent is extended or adjusted under 35 U.S.C. 154(b) by 233 days.

(21) Appl. No.: 10/164,558

(22) Filed: Jun. 10, 2002

(65) Prior Publication Data

US 2003/0033492 A1 Feb. 13, 2003

(30) Foreign Application Priority Data

Aug. 8, 2001 (JP) ........................................ 2001-240071

(51) Int. Cl.[7] ............................................. G06F 12/00
(52) U.S. Cl. .......................... 711/156; 711/5; 711/105; 711/106; 711/118; 711/119; 711/120; 711/123; 711/125; 711/126; 711/128; 711/141; 711/143; 711/144
(58) Field of Search .............................. 711/5, 105, 106, 711/118, 119, 120, 123, 125, 126, 128, 141, 143, 144

(56) References Cited

U.S. PATENT DOCUMENTS

| 5,488,709 A | * | 1/1996 | Chan ............................ 711/118 |
| 5,991,851 A | | 11/1999 | Alwais et al. ............... 711/106 |
| 5,999,474 A | | 12/1999 | Leung et al. ................ 365/222 |
| 6,028,804 A | | 2/2000 | Leung et al. ................ 365/222 |
| 6,075,740 A | | 6/2000 | Leung et al. ................ 365/222 |
| 6,381,671 B1 | * | 4/2002 | Ayukawa et al. ........... 711/104 |
| 6,415,353 B1 | * | 7/2002 | Leung ......................... 711/106 |

* cited by examiner

Primary Examiner—Nasser Moazzami
(74) Attorney, Agent, or Firm—Miles & Stockbridge P.C.

(57) ABSTRACT

A semiconductor device is designed to hide refresh operations even when the data width of a cache line differs from that of the external data bus in a memory that uses a cache memory and a DRAM with a plurality of banks. The semiconductor device includes a plurality of memory banks BANK0 to BANK127, each having a plurality of memory cells, as well as a cache memory CACHEMEM used to retain information read from the plurality of memory banks. The cache memory CACHEMEM includes a plurality of entries, each having a data memory DATAMEM and a tag memory TAGMEM. The data memory DATAMEM has a plurality of sub lines DATA0 to DATA3 and the tag memory TAGMEM has a plurality of valid bits V0 to V3 and a plurality of dirty bits D0 to D3.

13 Claims, 8 Drawing Sheets

FIG.3A

|   | TAG | V3 | V2 | V1 | V0 | D3 | D2 | D1 | D0 | DATA3 | DATA2 | DATA1 | DATA0 |
|---|---|---|---|---|---|---|---|---|---|---|---|---|---|
| 0 | 0000100 | 1 | 1 | 1 | 1 | 0 | 1 | 0 | 0 | A | M | C | D |
| 1 | 0000100 | 0 | 1 | 1 | 1 | 0 | 1 | 1 | 1 | ////// | N | O | P |
| 2 | 0000100 | 1 | 1 | 1 | 1 | 0 | 0 | 0 | 0 | a | b | c | d |
| ⋮ | ⋮ | ⋮ | | | | ⋮ | | | | ⋮ | | | |
| 255 | 0000100 | 0 | 0 | 1 | 1 | 0 | 0 | 1 | 1 | ////// | ////// | Y | Z |

FIG.3B

BANK4

|   | 3 | 2 | 1 | 0 |
|---|---|---|---|---|
| 0 |   | abcd | EFGH | ABCD |
| 1 |   |   |   |   |
| ⋮ |   | ⋮ |   |   |
| 63 |   |   |   |   |

BANK8

|   | 3 | 2 | 1 | 0 |
|---|---|---|---|---|
| 0 |   | QRST |   | UVWX |
| 1 |   |   |   |   |
| ⋮ |   | ⋮ |   |   |
| 63 | IJKL |   |   |   |

SEMICONDUCTOR DEVICE WITH MULTI-BANK DRAM AND CACHE MEMORY

FIELD OF THE INVENTION

The present invention relates to a semiconductor device with a multi-bank DRAM and a cache memory. More particularly, the invention relates to a semiconductor device with a multi-bank DRAM and a cache memory, preferably used for fast, highly integrated, and low power consumption apparatuses. The invention also relates to a semiconductor device with a multi-bank DRAM and a cache memory, in which logical circuits and semiconductor memory devices are integrated.

BACKGROUND OF THE INVENTION

The static random access memory (referred to as SRAM hereinafter) is the main stream of the on-chip memories to be mounted on an LSI together with other parts. In spite of this, the SRAM, since it is composed of six transistors, requires a large space for disposing memory cells, encountering a problem of mounting space when it employed to be mounted on an LSI together with other parts.

There is another method where a dynamic random access memory (referred to as DRAM hereinafter) is mounted on an LSI together with other parts. The DRAM that is composed of a transistor and a capacitor has small memory cells in disposing area, leading to a comparatively large capacity. The DRAM, however, has disadvantages in which its cycle time is slower than that of the SRAM and the DRAM is required to be refreshed, causing it rather complicated and troublesome to control the DRAM. Of these problems, the cycle time, as it has been well known, can be speeded up by reducing the number of memory cells disposed on each bit line thereof, while the refreshing cannot be hidden completely from external.

Recently, however, U.S. Pat. No. 5,999,474 has disclosed a method that can hide refresh operations with use of DRAM memory cells. In the case of the semiconductor memory described in the USP (referred to as 1T-SRAM hereinafter according to the USP), the semiconductor memory is composed of a DRAM divided into a plurality of banks, an SRAM having a capacity equivalent to that of a bank, and the SRAM portion is used as a cache memory. While the cache memory is being hit, the DRAM is in the idle state (no access is done thereto). The idle time is used for a dedicated controller to complete the refresh operation in the DRAM. This eliminates the need of external control for the refresh operation. In addition, the method is constituted such that a direct mapped caching scheme having easy control of the cache memory can be employed to control the cache memory; and the cache memory is connected to the DRAM via a dual port composed of a read data bus and a write data bus. The constitution permits of writing back to the cache memory from the DRAM as well as of doing the fetch on write operation from the DRAM to the cache memory just in one cycle. Also with this constitution, even when an access to the cache memory is decided as a miss hit, for example, during a read operation, the target data can be read immediately from the DRAM, thereby the data can be output in one cycle after the address input. This makes it possible to expect that an on-chip memory can be easily controlled with use of a DRAM composed of a cache memory having a capacity equivalent to that of a bank, and multiple banks as described above.

Nevertheless, it has been found by examining the above described known invention that it would be difficult to hide refresh operations under a predetermined condition where the data width differs between the cache line of the cache memory provided in the 1T-SRAM differs and the data bus that connects the 1T-SRAM to an external device.

A cache memory usually comprises a plurality of entries, each consisting of a data part used to store data and a tag part used to store the address of the data part. Each entry is provided with a dirty bit used to denote updating of stored data. When data is written in an entry, thereby the data in the entry is updated, this dirty bit is set. When the data in the entry is to be replaced, the data is written back into the main memory, thereby the data coherency is kept between the cache memory and the main memory. The method is referred to as the write-back method.

In the cache memory of said USP, when a write access is requested to an entry that has retained dirty data and the access is decided as a cache miss (a different tag address in the same entry is hit), the data is written back from the cache memory to the DRAM, then allocated (fetch on write) from the DRAM to the accessed cache line to keep the data coherency between the cache memory and the DRAM In other words, the access is controlled as if it were a write-back operation performed by the write allocation method. According to the configuration of the above invention, each bank address of the DRAM is assigned to a cache memory tag. Therefore, the write-back operation and the fetch on write operation are executed in different two banks. For example, when an access related to the bank B is done to an entry while the data related to a bank A is stored in the entry, the data is written back in the bank A and a fetch on write operation is done in the bank B respectively. After that, when an access related to the bank A is done for the same entry, a write-back access to the bank B is done and a fetch-on write operation is done for the bank A. Consequently, for example, when write access cache misses occurs consecutively in the same entry, the two banks in the DRAM come to be kept accessed. In other words, no refresh operation can be done in those two banks, thereby some data in the DRAM might be damaged.

SUMMARY OF THE INVENTION

Under such circumstances, it is an object of the present invention to provide a memory device that can solve the above problems.

According to one aspect of the present invention, the memory device composed of a DRAM consisting of a cache memory and a plurality of banks is constituted such that: each cache line of a cache memory in a memory device is divided into sub lines; and there is provided each sub line with a valid bit and a dirty bit so as to hide refresh operations. This makes it possible to execute only a write-back operation for the DRAM array when a write access to a sub line in which the dirty bit is set is decided as a cache miss.

At the same time, the valid bit of each sub line other than the accessed one is reset to invalidate their data, thereby eliminating the allocate operation from the DRAM array. This can prevents two banks from being kept accessed.

According to another aspect of the invention, there is constituted such that the DRAM portion is composed of multiple banks; a bank address is assigned to each tag of the cache memory; and the internal data bus disposed between the cache memory and the DRAM is connected to the DRAM array DRAMARY via a dual port consisting of a read data bus and a write data bus. This allows a write-back operation into the DRAM array and a data allocate operation (fetch-on write) from the DRAM to executed in two different banks at the time of, for example, a read access cache miss. Thus, both of the commands can be executed in one cycle.

Consequently, the above conventional problem is solved; concretely, even when consecutive write accesses to the same cache line are decided as cache misses, the DRAM array can be driven into the idle state in which no access is done, thereby the refresh operation can be executed therein.

The effects of the present invention is to realize a memory with excellent operability without causing the refresh operation in the DRAM array to delay external accesses, in other words, to realize a memory compatible with an SRAM in which refresh operations can be hidden from external.

Other and further objects, features and advantages of the invention will appear more fully from the following description.

BRIEF DESCRIPTION OF THE DRAWINGS

In the attached drawings:

FIGS. 3A and 3B are examples of a cache memory in the embodiment shown in FIG. 1;

DETAILED DESCRIPTION OF THE PREFERRED EMBODIMENTS

The preferred embodiments of the invention will be described with reference to the accompanying drawings. The circuit elements in each block in the embodiments, although not limited to below constitution, are formed on one semiconductor substrate made of, for example, single crystal silicon with use of such integrated circuit technologies as the well-known CMOS (complementary MOS transistors) technology, etc. Reference symbols of circuits such as MOSFET (Metal Oxide Semiconductor Field Effect Transistor), when no circle is marked for the gate, denote an N type MOSFET (NMOS) and it is distinguished from P type MOSFET (PMOS) having a circle-marked gate. Hereinafter, a MOSFET will be referred to simply as a MOS or MOS transistor. However, this does not mean that the present invention applies only to field effective transistors with an oxide film provided between the metallic gate and the semiconductor layer; the present invention may also apply to any circuits that employ such general FETs as the MISFET (Metal Insulator Semiconductor Field Effect Transistor), etc.

Although meaning differs between latch and flip-flop or register originally in the strict sense of the word, latch will be representative of them unless otherwise defined specially.

First Embodiment

Figure 1:
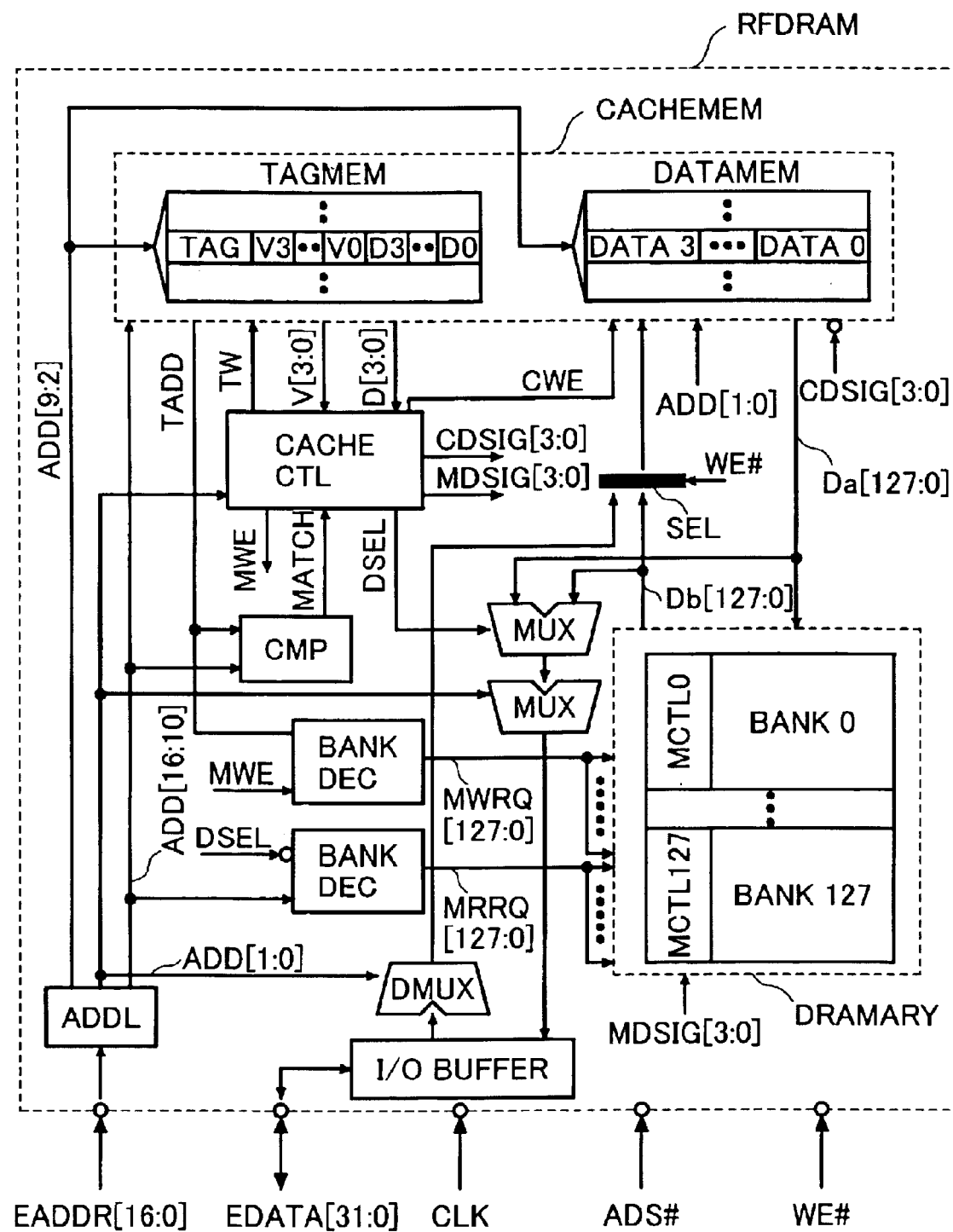
FIG. 1 is a block diagram of a refresh free dynamic memory in an embodiment of the present invention.
Figure 4A:
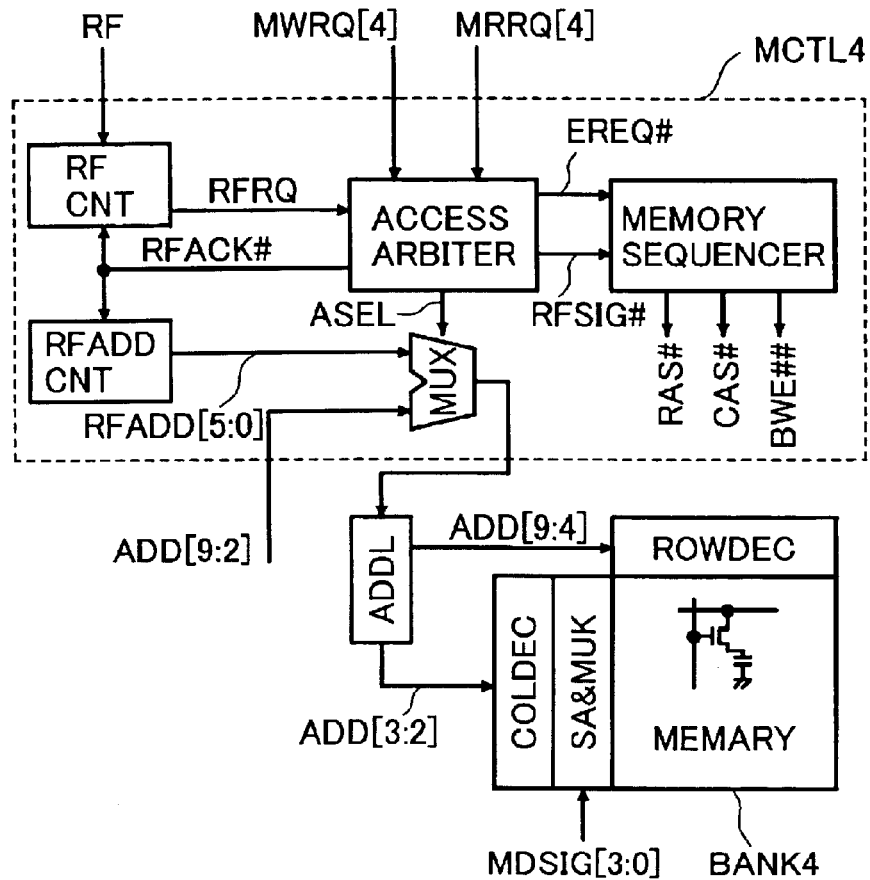
FIGS. 4A and 4B are examples of a memory controller in the embodiment shown in FIG. 1.
Figure 4B:
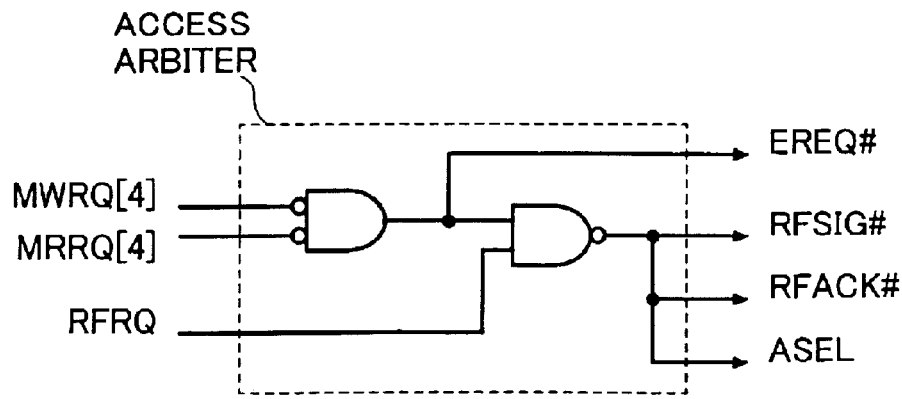
Figure 5:
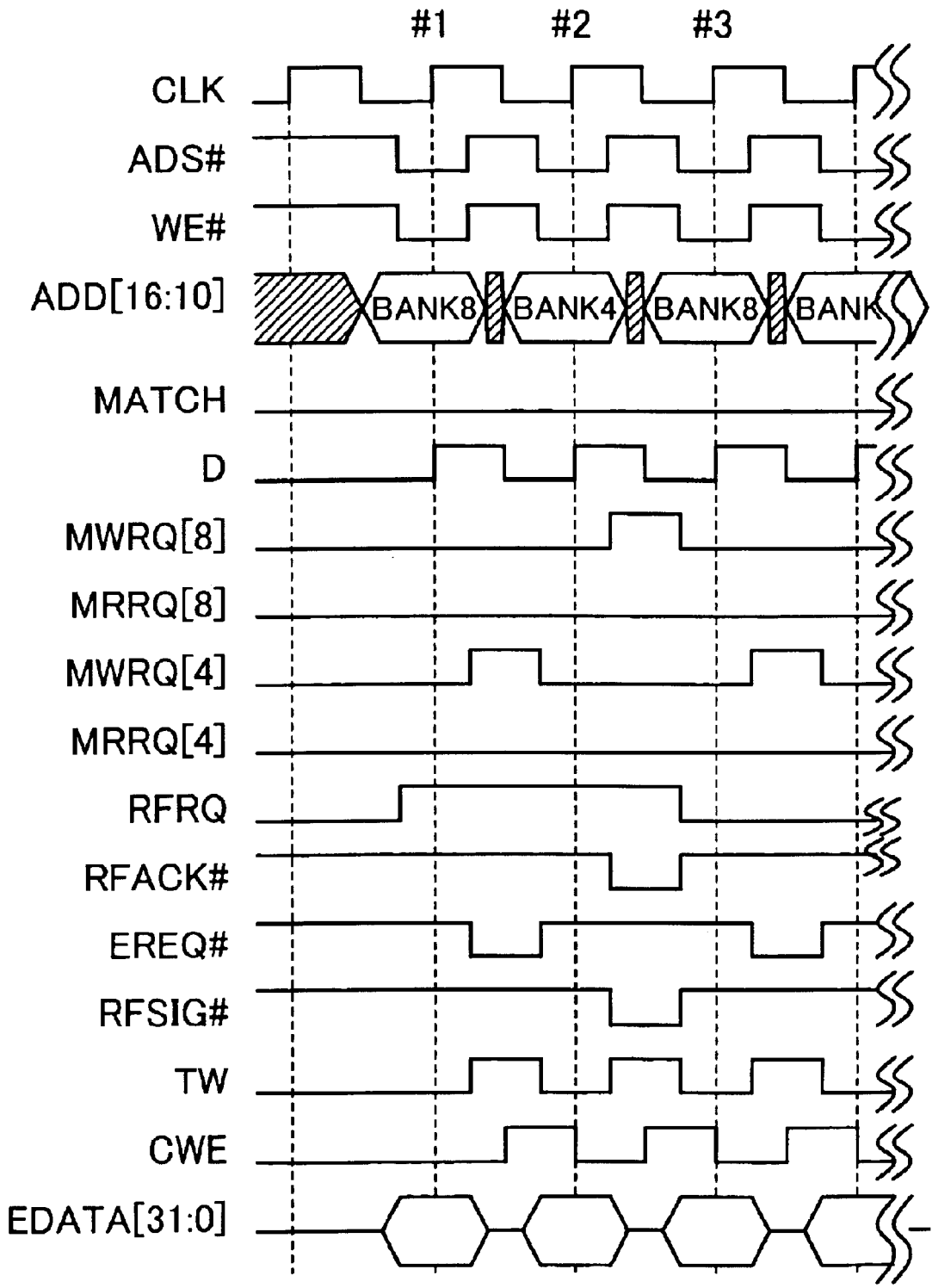
FIG. 5 is an example of an operation waveform that denotes the conventional problem solved by the refresh free dynamic memory of the present invention.

FIG. 1 shows a block diagram of a refresh free dynamic memory RFDRAM (referred to as RFDRAM hereinafter), which is a memory device in an embodiment of the present invention. FIG. 2 shows a flowchart of the operation of the RFDRAM. FIGS. 3A and 3B show embodiments of a cache memory and FIGS. 4A and 4B show embodiments of a DRAM memory array used in the RFDRAM shown in FIG. 1. FIG. 5 shows a timing chart of the RFDRAM denoting that it is possible to avoid a confliction between an access and a refresh operation requested to the DRAM array concurrently.

As shown in FIG. 1, the RFDRAM is composed of a cache memory CACHEMEM and a DRAM array DRAMARY, which consists of a plurality of DRAM banks (128 banks (bank 127 to bank 0)) In the example shown in FIG. 1, the capacity of one bank is 32 k bits and the total capacity of the memory is 4M bits. The capacity of the cache memory CACHEMEM is equivalent to that of one bank. In FIG. 1, the cache memory consists of 16-byte wide cache lines and 256 entries (total capacity: 32 k bits). The cache memory CACHEMEM is composed of SRAM cells, each consisting of 4 or 6 transistors. The cache memory CACHEMEM is provided with a tag memory TAGMEM and a data memory DATAMEM used to store data. In addition, the tag memory TAGMEM consists of a tag address TAG used to store an address, valid bits V3 to V0 and dirty bits D3 to D0 used to manage the data memory DATAMEM. On the other hand, each cache line of the data memory DATAMEM is divided into a plurality of sub lines DATA3 to DATA0. In other words, the cache line in this embodiment consists of four sub lines DATA3 to DATA0 and each of the sub lines DATA3 to DATA0 is provided with a valid bit (V3 to V0) and a dirty bit (D3 to D0). CACHECTL denotes a cache controller, CMP denotes a comparator, SEL denotes a selector, BANKDEC denotes a bank decoder, MUX denotes a multiplexer, and DMUX denotes a demultiplexer. ADDL denotes address latch and MCTL127 to 0 denotes memory controllers. The cache memory CACHEMEM and the DRAM array DRAMARY are connected to each other via a dual port consisting of internal data buses Da[127:0] and Db[127:0]. Because the cache memory CACHEMEM and the DRAM array are connected via an internal data bus Da[127:0] and the dual port of Db[127:0] such way, for example, it is possible to execute writing back into the DRAM array and data allocation (fetch-on write) from the DRAM in different two banks at the time of a read access cache miss, thereby both of the commands can be executed in one cycle to speed up the operation. If the data width is the same between each of the sub lines DATA3 to DATA0 used to store data and the external data bus EDATA[31:0] at this time, the controllability will be improved more. The external data bus EDATA [31:0] in this case means a bus for connecting the RFDRAM regarded as one semiconductor device to another calculation circuit. The external data bus EDATA[31:0] is connected to a data input/output node. When the data width of both internal data buses Da[127:0] and Db[127]0] is assumed as A, the number of divided sub lines of the cache memory is assumed as N, and the data width of the external data bus EDATA[31:0] is assumed as B, the relationship among them should be A=N·B so as to improve the controllability. The data width A of the internal data bus Da[127:0] at this time denotes the data width of either the read data bus or the write data bus. In this embodiment, it is defined as 128.

The operation of the RFDRAM in this embodiment will be described. Accesses to the RFDRAM are classified into four types of results; read access cache hit, read access cache miss, write access cache hit, and write access cache miss. Each of those access results will be described sequentially with reference to the flowcharts shown in FIGS. 1 and 2.

(1) Read Access Cache Hit

Figure 2A:
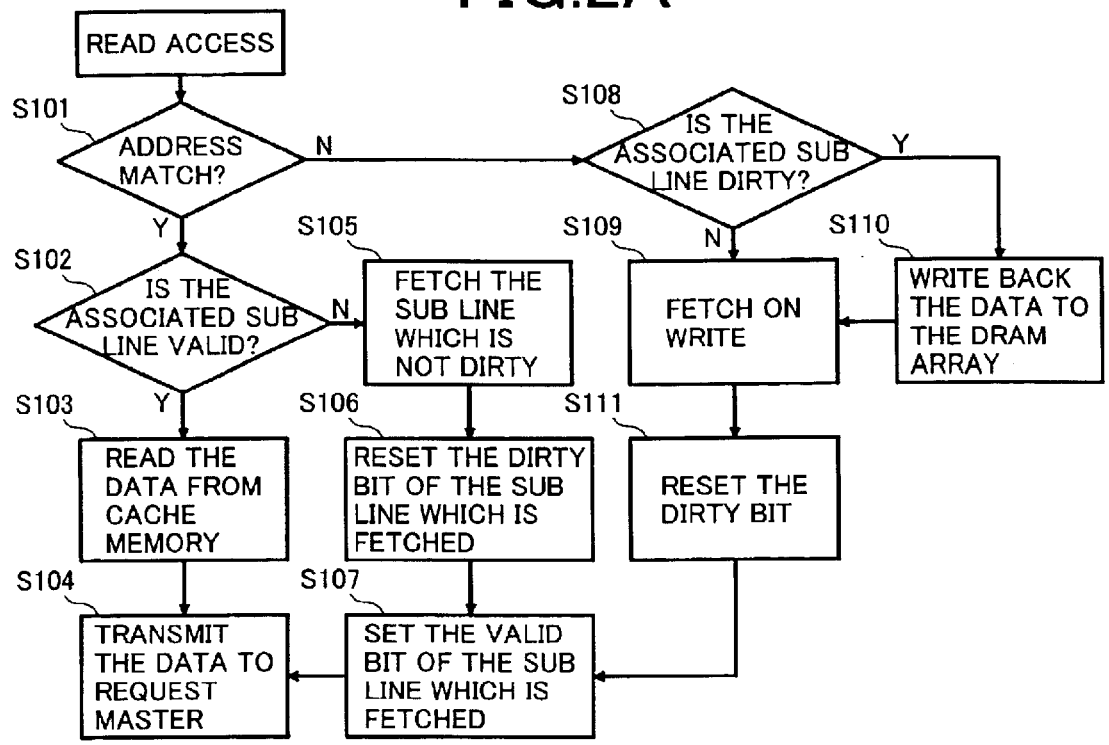
FIGS. 2A and 2B are flowcharts of the operation of the refresh free dynamic memory of the present invention.

In FIG. 2A, when a read access is requested to the RFDRAM, the tag address TAG of the cache memory CACHEMEM is compared with the address inputted from external (S101). When the addresses match, it is then decided whether or not the target sub line is valid (S102). If the valid bit of the sub line is set and the data is valid, the access is decided as a cache hit. This means that the requested data exists in the cache memory CACHEMEM. The requested data is then read from the cache memory CACHEMEM (S103) and transferred to the request master (S104).

The series of the above operations will be described more in detail with reference to FIG. 1. An address of a read access requested to the RFDRAM from external is inputted via the external address bus EADDR[16:0]. At this time, the address strobe signal ADS# is driven low and the write enable signal WE# is driven high. The inputted address is then divided into the upper address ADD[16:10], the middle address ADD[9:2], and the lower address ADD[1:0] via the address latch ADDL. The upper address ADD[16:10] corresponds to a bank address and it is compared with the corresponding tag address TAG. The middle address ADD[9:2] is used to refer to the tag memory TAGMEM. The lower address ADD[1:0] is used to select a target sub line in the data memory DATAMEM. In order to simplify the drawing (FIG. 1), some control signals such as the upper address ADD[16:10], the middle address ADD[9:2], the lower address ADD[1:0], the clock CLK, the address strobe signal ADS#, the write enable signal WE#, etc. are omitted in FIG. 1.

At the time of a read access, it is decided whether or not the requested data exists in the cache memory CACHEMEM as follows. At first, the middle address ADD[9:2] is used to refer to the tag memory TAGMEM. The referred tag address TAG is inputted to the comparator CMP via the tag address bus TADD. The valid bit (V3 to V0), as well as the dirty bit (D3 to D0) of the referred entry are inputted to the cache controller CACHECTL. The comparator CMP then compares the inputted upper address ADD[16:10] with the referred tag address TAG. When the two address values are identical, the comparator CMP drives the address match signal MATCH high and inputs the signal MATCH to the cache controller CACHECTL. The cache controller CACHECTL then decides whether or not the requested data exists in the cache memory CACHEMEM according to the address match signal MATCH, the valid bit (V3 to V0), and the lower address ADD[1:0].

A data decision flow will be described with reference to FIGS. 3A and 3B. FIGS. 3A and 3B show examples of the cache memory shown in FIG. 1. The cache memory consists of tag addresses TAG, valid bits V3 to V0, and dirty bits D3 to D0. The cache memory in this case has 256 entries. In FIG. 3A, the entry 0 holds 4 as a tag address, (1111) as the valid bit V(3:0), and (0100) as the dirty bit D[3:0]. The sub lines DATA3 to DATA0 hold A, M, C, and D data items respectively.

It is assumed here that an upper address ADD[16]10]= (0000100), a middle address ADD[9:2]=(00000000), and a lower address ADD[1:0]=(11) are set in the inputted external address ADD[16:0] for a read access. This means that the upper address (bank address) is "4", the entry is "0", the address of the sub line to be referred is "3", and the target sub line is DATA3. In FIG. 3A, the tag address TAG of the entry 0 is "4", which is equal to the inputted upper address. Consequently, the comparator CMP drives the address match signal MATCH high. In addition, the valid bit V3 is set. This means that the requested data exists in the cache memory. The cache controller CACHECTL thus decides the read access as a cache hit and drives the data select signal DSEL high.

The cache controller CACHECTL, when deciding a read access as a cache hit such way, drives the cache write enable signal CWE low to read data from the cache line referred from the data memory DATAMEM. In the above case, the cache controller CACHECTL reads the data items A, M, C, and D from the target cache line of the entry 0. The read cache line data is inputted to the multiplexer MUX via the internal bus Da[127:0]. Then, a data select signal DSEL is inputted to the multiplexer MUX to select the internal data bus Da[127:0] from the data memory DATAMEM or the internal data bus Db[127:0] from the DRAM array DRAMARY. Because the read access is decided as a cache hit in this case, the internal data bus Da[127:0] is selected. After that, the lower address ADD[1:0]=(11) is used to select the desired sub line DATA3 of the cache line and output the data to the external data bus EDATA[31:0]. In this connection, "A" is output from the sub line DATA3 to external.

This completes the description of the read access decided as a cache hit. Because the cache hit means that the desired data exists in the cache memory CACHEMEM, the DRAM array is not accessed. Consequently, all the banks in the DRAM array DRAMARY are idle, so that the memory controller MCTL0 to MCTL127 can refresh all those banks.

(2) Read Access Cache Miss

A read access cache miss will be described. At first, addresses are compared in step S101 shown in FIG. 2A. When the addresses match, control goes to step S102. When the addresses do not match, control goes to step S108.

When the addresses match, it is decided whether or not the valid bit is set. Because the valid bit is not set in the target sub line in this case, the desired data does not exist in the cache memory CACHEMEM. This means that the access is decided as a cache miss. Control thus goes to step S105. Because the desired data does not exist in the cache memory CACHEMEM, the data must be read from the DRAM array DRAMARY. The read data is then allocated (fetch on write) to the cache memory CACHEMEM. At this time, no data is fetched from any sub line in the same entry, in which both of the valid bit and the dirty bit are set. This is because the above data is the latest one and if the data is fetched from the DRAM array DRAMARY, the data in the sub line comes to be replaced with older data. After that, the dirty bit is reset (step S106) and the valid bit is set (step S107) in the sub line from which the data is fetched, then the data read from the DRAM array DRAMARY is transferred to the request master (step S104).

When the addresses do not match, it is decided whether or not the dirty bit is set in the target sub line of the referred cache line in step S108. When none of the sub lines of the cache line are not dirty, the desired data is read from the DRAM array DRAMARY and the read data is allocated (fetch on write) to the cache memory CACHEMEM (step S109). On the other hand, when any sub line of the referred cache line is decided as dirty, the data is written back from the sub line (step S110) into the cache memory CACHEMEM to keep the data coherency between them. In addition, the desired data is allocated (fetch on write) to the cache memory CACHEMEM_(step S109) from the DRAM array DRAMARY. After that, the dirty bit is reset in step S111 and the valid bit is set (step S107), then the data read from the DRAM array DRAMARY is transferred to the request master (step S104). The above operations will be described more in detail with reference to FIGS. 1 and 3. At first, such an operation to be performed when addresses match will be described.

(2-1) Address Match (at a Cache Miss Caused by Invalid Sub Line Data)

The operations up to the address comparison (step S101) at a read access miss are the same as those in the read access cache hit described above. It is assumed here that the upper address ADD[16:10]=(0000100), the middle address ADD[9:2]=(00000001), and the lower address ADD[1:0]=(11) are set in the inputted external address ADD[16:0]. In other words, the upper address (bank address) is "4", the entry is "1", and the address of the sub line to be referred is "3", and the target sub line is DATA3. In FIG. 3A, the tag address TAG of the entry 1 is "4", which is equal to the value of the inputted upper address. Consequently, the comparator CMP drives the address match signal MATCH high. However, the valid bit V3 of the sub line DATA3 is reset at this time. This means that the requested data does not exist in the cache memory CACHEMEM. The cache controller CACHECTL thus decides the read access as a cache miss.

Detecting a read access as a cache miss, the cache controller CACHECTL drives the data select signal DSEL low and inputs the signal to the bank decoder BANKDEC. The bank decoder BANKDEC decodes the upper address ADD[16:10] to drive the memory read request signal MRRQ[127:0]. In this connection, the upper address ADD[16:10]=(0000100) is decoded to select the bank address "4". The middle address ADD[9:2] is used to read data from a bank. In other words, ADD[9:4] of the middle address ADD[9:2] is used to refer to the row addresses 63 to 0 and ADD[3:2] is used to refer to the column addresses 3 to 0. In this example, therefore, 128 bits of data (E, F, G, and H) is read from the low address 0 and the column address 1 in the bank 4. The read data is inputted to the multiplexer MUX via the internal data bus Db[127:0]. When the access is decided as a cache miss, the data select signal DSEL is driven low, thereby the internal data bus Db[127:0] is selected and the desired data "E" is output to the external data bus EDATA[31:0] according to the lower address ADD[1:0]=(11). On the other hand, the data output from the bank 4 is inputted to the data memory DATAMEM via the selector SEL. The cache controller CACHECTL, since it decides the read access as a cache miss, drives the cache write enable signal CWE high to fetch on white the data read from the DRAM array DRAMARY. The cache controller CACHECTL drives the tag write signal TW high to write the upper address [16:10] in the tag memory TAGMEM. As described above, no fetch on write can be performed for any sub line in which the dirty bit is set, because the latest data of N, O, and P exists on the cache line 1, which is a target of fetch on write in FIG. 3A. Accordingly, data F, G and H among the E, F, G, and H read from the bank are not fetched on write. To perform a fetch on write operation, the inverted signal of the cache data control signal CDSIG[3:0] received from the cache controller CACHECTL is used. The cache controller CACHECTL, when deciding an access as a cache miss, checks whether or not the valid bit is set, the dirty bit is set, and the address match signal MATCH is driven high in the cache line to be accessed. When the results of all the check items are YES, the cache controller CACHECTL drives the cache data control signal CDSIG[3:0] high. In other words, the cache controller CACHECTL outputs CDSIG[3:0]=(0111) to the cache line 1 in this case (if the addresses do not match, that is, when the address match signal MATCH is driven low, the cache controller CACHECTL outputs (0000)). Consequently, the cache controller CACHECTL performs fetch on write only for the sub line DATA3 with use of the inverted signal (1000). This completes the description for the operation of the cache controller CACHECTL at a read access cache miss when the addresses match and the target sub line is invalid.

(2-2) Cache Miss Caused by Address Unmatching

When it is decided that the addresses do not match in step S101 shown in FIG. 2A, control goes to step S108.

A description will be made for a case in which there is no sub line in which the dirty bit is set. For example, it is assumed here that the upper address ADD[16:10]=(0001000), the middle address ADD[9:2]=(00000010), and the lower address ADD[1:0]=(11) are set in the inputted external address ADD[16:0]. This means that the upper address (bank address) is "8", the entry is "8", the address of the sub line to be referred is "3", and the target sub line is DATA3. In FIG. 3A, data items of a, b, c, d are retained in the sub lines DATA3 to DATA0 of the entry 2. In this connection, no dirty data exists in those sub lines, so that a fetch on write operation is performed for all the cache lines (step S109). Because the tag address TAG of the entry 2 is 4, which differs from the inputted upper address, the comparator CMP drives the address match signal MATCH low. In other words, the data of the bank 4 also exists in the cache memory CACHEMEM, so that the cache controller CACHECTL decides the access as a cache miss and drives the data select signal DSEL low. The bank decoder BANKDEC selects the bank 8 and reads 128-bit data of Q, R, S, and T therefrom and outputs the desired data Q to the external bus EDATA[31:0] via the multiplexer MUX. On the other hand, the data output from the bank 8 is inputted to the data memory DATAMEM via the selector SEL, that is, a fetch on write operation is performed. The cache data control signal CDSIG[3:0] that denotes a sub line to fetch is output as CDSIG[3:0]=(0000), since there is no data in which the dirty bit is set and the addresses do not match. The inverted signal value of the CDSIG[3:0] thus becomes (1111). Consequently, fetch on write is to be performed for all the sub lines. In this example, Q, R, S, and T are fetched into the cache lines of the entry 2.

A description will be made for a case in which there is a sub line in which the dirty bit is set. For example, it is assumed here that the upper address ADD[16:10]=(0001000), the middle address ADD[9:2]=(1111111), and the lower address ADD[1:0]=(11) are set in the inputted external address ADD[16:0]. This means that the upper address (bank address) is "8", the entry is "255", the address of the sub line to be referred is "3", and the target sub line is DATA3. In FIG. 3A, the tag address TAG of the entry 255 is 4, which differs from the inputted upper address. The comparator CMP thus drives the address match signal MATCH low. In other words, the data of the bank 4 exists in the cache memory CACHEMEM. The cache controller CACHECTL thus decides the access as a cache miss and drives the data select signal DSEL low. In addition, in the entry 255, there are dirty-bit-set sub lines in which Y and Z are retained. Consequently, those data Y and Z must be written back into the DRAM array DRAMARY to keep the data coherency between them. The cache controller CACHECTL thus drives the memory write enable signal MWE high and the cache write enable signal CWE low. The memory write enable signal MWE and the tag address output via the tag address bus TADD are inputted to the bank decoder BANKDEC, thereby a bank in which data is written back is selected. In this case, the bank 4 is selected. On the other hand, the data to be written back is output from the data memory DATAMEM via the internal data bus Da[127:0]. However, because invalid data in which the valid bit is not set exists in the cache line of the entry 255, writing back of every sub line data comes to cause data damage. In order to avoid the problem, therefore, the cache controller CACHECTL sends the memory data control signal MDSIG [3:0]=(0011) to each memory controller MCTL to control the data to be written back. In other words, only the sub line data items Y and Z are written back into the bank 4.

How data is read from the bank 8 will be described. At first, the bank decoder BANKDEC selects the bank 8 according to the low-driven data select signal DSEL and the upper address ADD[16:10], reads the 128-bit data of I, J, K, and L, and outputs the requested data I to the external bus EDATA[31:0] via the multiplexer MUX. The memory data control signals MDSIG[3:0] are controlled so as to be driven high before they are inputted to the data-read bank. The controlling can be made easily with use of the selector SEL, etc., so that it is not shown here. On the other hand, the data output from the bank 8 is inputted to the data memory DATAMEM via the selector SEL, that is, a fetched on write operation is performed. Because the addresses do not match in this case, the cache controller CACHECTL outputs the cache data signal CDSIG[3:0]=(0000) and the value of the inverted signal becomes (1111). Consequently, fetch on write is to be performed for all the sub lines. In this example, data items I, J, K, and L are thus fetched into the cache line of the entry 255.

This completes the description for the operation of the cache controller CACHECTL when the read access is decided as a cache miss. When an access is decided as such a cache miss, the requested data does not exist in the cache memory CACHEMEM. Consequently, the DRAM array DRAMARY is accessed. In the above example, a read or write access is requested to the banks 4 and 8 respectively. Consequently, all the banks other than those banks 4 and 8 can be refreshed by the memory controller MCTL. The banks 4 and 8 can be refreshed later when they are idle. In addition, if an external access and a refresh operation are requested to a bank concurrently, the memory controller MCTL gives priority to the external access and refreshes the bank when the bank is idle (to be described more in detail later).

(3) Write Access Cache Hit

Figure 2B:
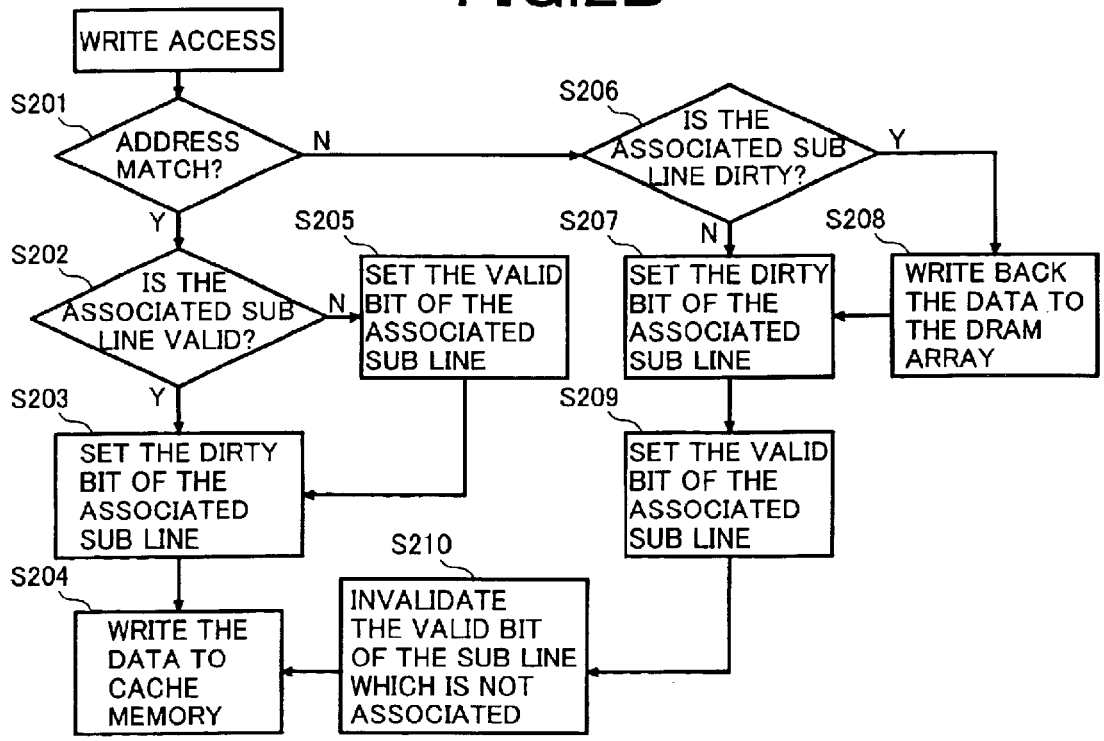

In FIG. 2B, when a write access is requested to the RFDRAM, the comparator CMP compares the tag address TAG of the cache memory CACHEMEM with the address inputted from external just like the read access described above (S201). When the addresses match, the write access is decided as a cache hit regardless of whether or not the valid bit is set in the sub line. After that, it is decided whether or not the valid bit is set in the target sub line in step S202. When the valid bit is set, the dirty bit is set in the sub line (step S203), then data is written in the cache memory CACHEMEM. On the other hand, when it is decided in step S202 that the valid bit is not set in the sub line, the valid bit is set (step S205), then the dirty bit is set (S203) in the sub line to write data in the cache memory CACHEMEM. Hereinafter, the operation of the above write access cache hit will be described more in detail with reference to FIGS. 1 and 3.

Upon an external access request, the address is inputted via the external address bus EADDR[16:0] and the data is inputted via the external data bus EDATA[31:0]. The address strobe signal ADS# is then driven low and the write enable signal WE# is driven low. The cache controller CACHECTL, when detecting the write access request from the address strobe signal ADS# and the write enable signal WE#, compares the upper address ADD[16:10] inputted from external with the tag address TAG retained in the tag memory TAGMEM just like the read access described above. At this time, it is assumed that the upper address ADD[16:10]=(0000100), the middle address ADD[9:2]= (00000000), and the lower address ADD[1:0]=(11) are set in the inputted external address ADD[16:]. This means that the upper address (bank address) is "4", the entry is "0", the address of the sub line to be referred is "3", and the target sub line is DATA3. In FIG. 3A, the tag address TAG of the entry 0 is "4", which is equal to the inputted upper address value. Consequently, the comparator CMP drives the address match signal MATCH high. The cache controller CACHECTL then decides the write access as a cache hit, since the address match signal MATCH is driven high for the write access. The controller CACHECTL thus drives the cache write enable signal CWE high. On the other hand, the data received from external is inputted to the demultiplexer DMUX via the I/O buffer I/O BUFFER. In this connection, the inputted external data "e" is written in a proper position in the 128-bit data bus according to the lower address ADD[1:0]. In addition, the write enable signal WE# is driven low and inputted to the selector SEL, so that the external data bus is selected and the data is written in the data memory DATAMEM. The inputted data e is thus written in the sub line DATA3 of the entry 0. Due to this data updating, the dirty bit D3 is set. On the other hand, the cache controller CACHECTL drives the tag write signal TW high and writes the upper address ADD[16:10] in the tag memory TAGMEM.

When the valid bit is not set, for example, when the upper address ADD[16:10]=(0000100), the middle address ADD [9:2]=(00000001), and the lower address ADD[1:0]=(11) are set in the inputted external address ADD[16:0], the valid bit is not set in the sub line DATA3 of the entry 1 in FIG. 3A. In this case, therefore, the valid bit V3 and the dirty bit D3 are set and the data inputted from external is written in the sub line DATA3.

This completes the description for the operation in response to a write access cache hit. Similarly to the read access time described above, the requested data is written in the cache memory CACHEMEM at a cache hit. Consequently, all the banks in the DRAM array DRAMARY go into the idle state, so that the memory controllers MCTL0 to MCTL127 can refresh those banks.

(4) Write Access Cache Miss

A write access cache miss is to be processed as follows. When address unmatching is decided in the address comparison in step S201 shown in FIG. 2B, control goes to step S206. After that, it is decided whether or not any dirty-bit-set sub line exists in the entry to be accessed (S206). When no dirty-bit-set sub line exists, the data inputted from external is written and the valid bit and the dirty bit are set in the target sub line (S207, S209). After that, the valid bit is reset in each of other sub lines to invalidate the data therein (S210). Data is written in the cache memory CACHEMEM under the controlling. On the other hand, when a dirty-bit-set sub line is found in step S206, the data must be written back in the DRAM array DRAMARY (S208). After that, control goes to step S207 to write data in the cache memory CACHEMEM just like the above case.

The above operations will be described more in detail with reference to FIGS. 1 and 3. At first, a description will be made for a case in which no dirty-bit-set sub line is found in step S206. The address comparison in this case is the same as that for the above described write access cache hit. The description will thus be omitted here. At this time, it is assumed that the upper address ADD[16:10]=(0001000), the middle address ADD[9:2]=(00000010), the lower address ADD[1:0]=(11) are set in the inputted external address ADD[16:0] and data "e" is inputted via the external data bus EDATA[31:0]. This means that the upper address (bank address) is "8", the entry is "2", the address of the sub line to be referred is "3", and the target sub line is DATA3. In FIG. 3A, the data items retained in the entry "2" to be accessed are a, b, c, and d. In other words, no data is updated in the entry "2" and the dirty bit is reset in every sub line. The tag address TAG of the entry 2 is 4, which differs from the inputted upper address. The comparator CMP thus drives the address match signal MATCH low, thereby the cache controller CACHECTL decides the access as a cache miss. After that, the cache controller CACHECTL drives the cache write enable signal CWE high and writes the data "e" received from external in the sub line DATA3 of the entry 2. Then, the valid V3 and the dirty D3 of the sub line DATA3 are set and the valid bit and the dirty bit of each of other sub lines are reset to invalidate the data therein. In addition, the cache controller CACHECTL drives the tag write signal TW high to write the upper address ADD[16:10] in the tag memory TAGMEM. Under the controlling, the DRAM array DRAMARY is never accessed by a write back operation even at a write access cache miss unless any dirty-bit-set sub line exists in the entry to be accessed. In other words, because all the banks are idle, they can be refreshed without delaying any external access.

A description will be made for a case in which a dirty-bit-set sub line is found in step S206. For example, it is assumed here that the upper address ADD[16:10]= (0001000), the middle address ADD[9:2]=(00000001), the lower address ADD[1:0]=(11) are set in the inputted external address ADD[16:0] and data "e" is inputted via the external data bus EDATA[31:0]. This means that the upper address (bank address) is "8", the entry is "1", the address of the sub line to be referred is "3", and the target sub line is DATA3. The tag address TAG of the entry 1 is 4, which differs from the inputted address. The cache controller CACHECTL thus drives the tag write TW high and writes the upper address ADD[16:10] in the tag memory TAGMEM. The cache controller CACHECTL then drives the cache write enable signal CWE high to write the data "e" received from external in the sub line DATA3 of the entry 1. At this time, the sub lines of this entry 1 include dirty-bit-set data N, O, and P. Those data items must thus be written back in the bank 4. At this time, the data of the sub line DATA3 cannot be written back. Similarly to the read access cache miss described above, it must be noted that the data is invalid and the original data might be damaged by a write back operation. Consequently, the cache controller CACHECTL outputs (0111) according to the memory data control signal MDSIG [3:0] and sends those signals to the memory controller MCTL. Such way, the cache controller CACHECTL controls so as to write back data from all the sub lines other than the DATA3.

Under the controlling as described above, a write-back access is made to the DRAM array DRAMARY when a dirty-bit-set sub line exists in the entry to be accessed. In the above case, data is written back from the bank 4. However, because other banks are idle, they can be refreshed. The bank 4 may be refreshed later when the bank 4 is idle. When a write-back operation and a refresh operation are requested to a bank concurrently, priority is given to the write-back operation, then the refresh operation is made later when the bank is idle.

How to process a memory access and a refresh operation concretely will be described with reference to FIGS. 4 and 5. FIG. 4A shows an embodiment of the memory controller shown in FIG. 1. The memory controller comprises an access arbiter ACCESS ARBITER, a memory sequencer MEMORY SEQUENCER, a refresh counter RFCNT, a refresh address counter RFADDCNT, and a multiplexer MUX. In the example shown in FIGS. 4A and 4B, a memory controller MCTL4 of the memory bank BANK4 are shown. The memory bank BANK 4 comprises a row decoder ROWDEC, a column decoder COLDEC, a sense amplifier SA, a multiplexer MUX, and a memory array MEMARY. ADDL denotes an address latch. FIG. 4B shows an embodiment of the access arbiter ACCESS ARBITER. FIG. 5 shows a timing chart of a memory access and a refresh operation when an access is requested to a bank.

A write access cache miss will be described with reference to FIGS. 3 and 4. It is assumed here that the upper address ADD[16:10]=(0001000), the middle address ADD [9:2]=(00000001), the lower address ADD[1:0]=(11) are set in the inputted external address ADD[16:0] and data e is inputted via the external data bus EDATA[31:0]. In FIGS. 3A and 3B, the tag address TAG of the entry 1 of the cache memory CACHEMEM is 4, the dirty bit is set in each of the data items N, O, and P in the sub lines DATA2 to DATA0. Those data items must thus be written back from the memory bank BANK4. Consequently, the cache controller CACHECTL drives the memory write request signal MWRQ[4] high to write back data from the memory bank BANK4. The access arbiter ACCESS ARBITER then detects the memory write request signal MWRQ[4] and drives the external access request signal EREQ# low to input the signal to the memory sequencer MEMORY SEQUENCER. Although the configuration of the access arbiter ACCESS ARBITER is not limited specially, it can be configured with use of a 2-input NOR circuit and a NAND circuit as shown in FIG. 4B. The memory sequencer MEMORY SEQUENCER, when receiving an access request sent by the external access request signal EREQ#, generates a row address strobe signal RAS#, a column address strobe signal CAS#, and a bank write enable signal BWE# to control the operation of the memory array MEMARY. Those array control signals may be generated just like a general non-synchronous DRAM controller, of course. The access arbiter ACCESS ARBITER drives the access selector signal ASEL high and inputs the signal to the multiplexer MUX. In this connection, the multiplexer MUX selects ADD[9:2] as an external input address and inputs the address to the row decoder ROWDEC and the column decoder COLDEC via the address latch ADDL. The data to be written back, that is, N, O, and P data items are written back in the memory bank BANK4 according to the memory data control signal MDSIG[3:0]. When no refresh request is issued to the memory bank BANK4 and only a write-back access is executed as described above, the memory controller MCTL4 can process the external access immediately.

A description will be made for a confliction to occur between a write-back access and a refresh operation requested to the same bank. The refresh operation is executed in response to a refresh signal inputted to a memory controller MCTL. Although not shown specially here, the refresh signal RF may be issued by a refresh timer at regular intervals. The refresh counter RFCNT, when receiving a refresh signal RF, increases the value in the built-in counter by one and drives the refresh request signal RFRQ high to send the signal to the access arbiter ACCESS ARBITER. When a bank is refreshed while no access is requested to the bank, the access arbiter ACCESS ARBITER drives the refresh acknowledge signal RFACK# low and decreases the value in the built-in counter RFCNT by one. The refresh request signal RFRQ driven high is negated low when the value in the built-in counter RFCNT (the non-executed refresh count) reaches 0. On the contrary, when the value in the built-in counter RFCNT is not 0, that is, there is a non-executed refresh operation, the refresh counter RFCNT keeps the refresh request signal RFRQ high and continues the refresh request. Although the configuration of the refresh counter RFCNT is not limited specially, it may be configured, for example, by an up-down counter as disclosed in the U.S. Pat. No. 6,028,804.

A description will be made for a concrete example of a concurrent occurrence of a write access cache miss and a refresh operation request. If a write-back access request and a refresh signal RFRQ are issued to the memory bank BANK4 concurrently, the memory write request signal MWRQ[4] and the refresh request signal RFRQ are driven high and inputted to the access arbiter ACCESS ARBITER respectively. At this time, the access arbiter ACCESS ARBITER drives the external access request signal EREQ# low and the access selector signal ASEL high. The access arbiter ACCESS ARBITER then drives the refresh control signal RFSIG# and the refresh acknowledge signal RFACK# high respectively. Consequently, the write-back access is processed first. Because the refresh acknowledge signal RFACK# is driven high, the value of the internal counter does not decrease, thereby not reset to 0. In other words, the refresh request signal RFRQ is kept high to keep the refresh request valid.

This unprocessed refresh request is executed when the memory bank BANK4 is idle (while no external access is received). The access arbiter ACCESS ARBITER, receiving the refresh request signal RFRQ driven high, drives the refresh control signal RFSIG# low and the external access request signal EREQ# high respectively, then the access selector signal ASEL low. At this time, the multiplexer MUX selects the refresh address RFADD[5:0], thereby the memory bank BANK4 is refreshed. In addition, the refresh acknowledge signal RFACK# driven low by the access arbiter ACCESS ARBITER is inputted to the refresh counter RFCNT, thereby the value of the refresh counter RFCNT decreases by one and the refresh request processing is completed.

Under the controlling, the present invention realizes a memory with excellent operability without causing the refresh operation to delay external accesses.

A description will be made for an access pattern taken when consecutive access cache misses occur in this embodiment with reference to the timing chart shown in FIG. 5.

When a cache line is divided into sub lines and a valid bit and a dirty bit are set in each of those sub lines just like in the above embodiment of the present invention, the valid bit is invalidated at a write access cache miss to keep the data coherency in the cache line. FIG. 5 shows a case in which a confliction has occurred between a write access to the bank 8 and a refresh operation requested to the bank 4 concurrently at the timing of #1. At this time, the data of the bank 4 exists in the entry to be accessed and the dirty bit is set in the target sub line. Consequently, a write access to the bank 4 is decided as a cache miss. A write-back access is thus requested to the bank 4, thereby the MWRQ[4] is driven high and inputted to the memory controller MCTL4. The memory controller MCTL4 then processes the write-back access first, thereby the refresh operation in the bank 4 is delayed. The refresh request signal RFRQ is kept high. It is assumed here that a write access is requested to the same entry at the next timing #2. At this time, the data of the bank 8 exists in the entry to be accessed while the dirty bit is set in the target sub line, so that the write access is also decided as a cache miss. As a result, a write-back access is requested to the bank 8. According to this method, the sub lines other than the target one can be invalidated for write accesses, so that there is no need to fetch data from the bank 4, which has been required conventionally. Consequently, at a write access cache miss at #2, no read access is requested to the bank BANK4. The bank 4 thus goes into the idle state, receiving no access, thereby the bank 4 can be refreshed. Because each bank is refreshed such way, the refresh acknowledge signal RFACK# is driven low and the value of the internal counter in the refresh counter RFCNT decreases, thereby the refresh request signal RFRQ is negated.

As described above, the configuration of this embodiment can realize a memory with excellent operability, which never causes any refresh operation to delay external accesses. In addition, because a series of operations from cache hit decision to data input/output in any of a read access and a write access can be executed in one clock, the memory in this embodiment can be accessed from external just like a general SRAM.

According to the above embodiment, refresh operations can be hidden from external just with addition of a few hardware items to the subject apparatus even when the data width differs between the target cache line and the external data bus, although it has been impossible for any conventional method to hide refresh operations such way. In other words, it is only required to add valid bits and dirty bits used to manage data to the sub lines added newly to a cache line that are divided into sub lines. Because there is no need to change the configuration of the existing word lines and bit lines in the DRAM, no such problem as speed reduction in reading/writing from/in the DRAM at a cache miss arises.

According to the above embodiment, because the data part has a plurality of sub lines DATA3 to DATA0 and each of those sub lines DATA3 to DATA0 has a valid bit (V3 to V0) and a dirty bit (D3 to D0) corresponding to itself, banks other than an accessed bank after its cache miss can be refreshed. It is thus possible to hide those refresh operations from external.

At this time, the number of valid bits/dirty bits must be the same as the number of sub lines. Otherwise, when it is assumed that the data width of the internal data bus is A, the number of sub lines is N, and the data width of the external data bus is B, A=N·B should be satisfied to improve the operability of the memory. On the other hand, when a confliction occurs between a refresh operation and an external access request to the same bank, the memory controller controls such that the external access is processed first and the refresh operation is executed later when the bank is idle, receiving no access, thereby the refresh operation never causes external accesses to be delayed. Thus the embodiment can realize a memory with excellent operability.

While the preferred form of the present invention has been described, it is to be understood that modifications will be apparent to those skilled in the art without departing from the spirit of the invention. For example, while a cache memory consisting of only one bank is picked up as an example in the above description, the capacity is not limited specially. The cache memory may consist of more than one memory. In addition, the line size of the cache memory, the number of entries, etc. are not limited specially. The data width of the sub lines, the width of the external data bus, the number of divided sub lines are not limited specially.

Modifications are possible for the relationship among those items without departing the spirit of the present invention. Furthermore, the configuration of the DRAM array DRAMARY is not limited specially. The memory cell structure of the cache memory CACHEMEM is not limited specially. The cache memory CACHEMEM may also employ SRAM memory cells that use poly-resistors or TFT/CMOS SRAM cells that employ four or six transistors respectively. The DRAM array DRAMARY cells are not limited specially; they may be single-transistor cells that use a capacitor respectively, single-transistor planer memory cells, two-transistor memory cells, three-transistor memory cells, of course.

Some application programs may cope with the delay of external accesses, that is, may not require hidden refresh operations. The memory of this embodiment can apply to the case, of course.

Second Embodiment

Figure 6:
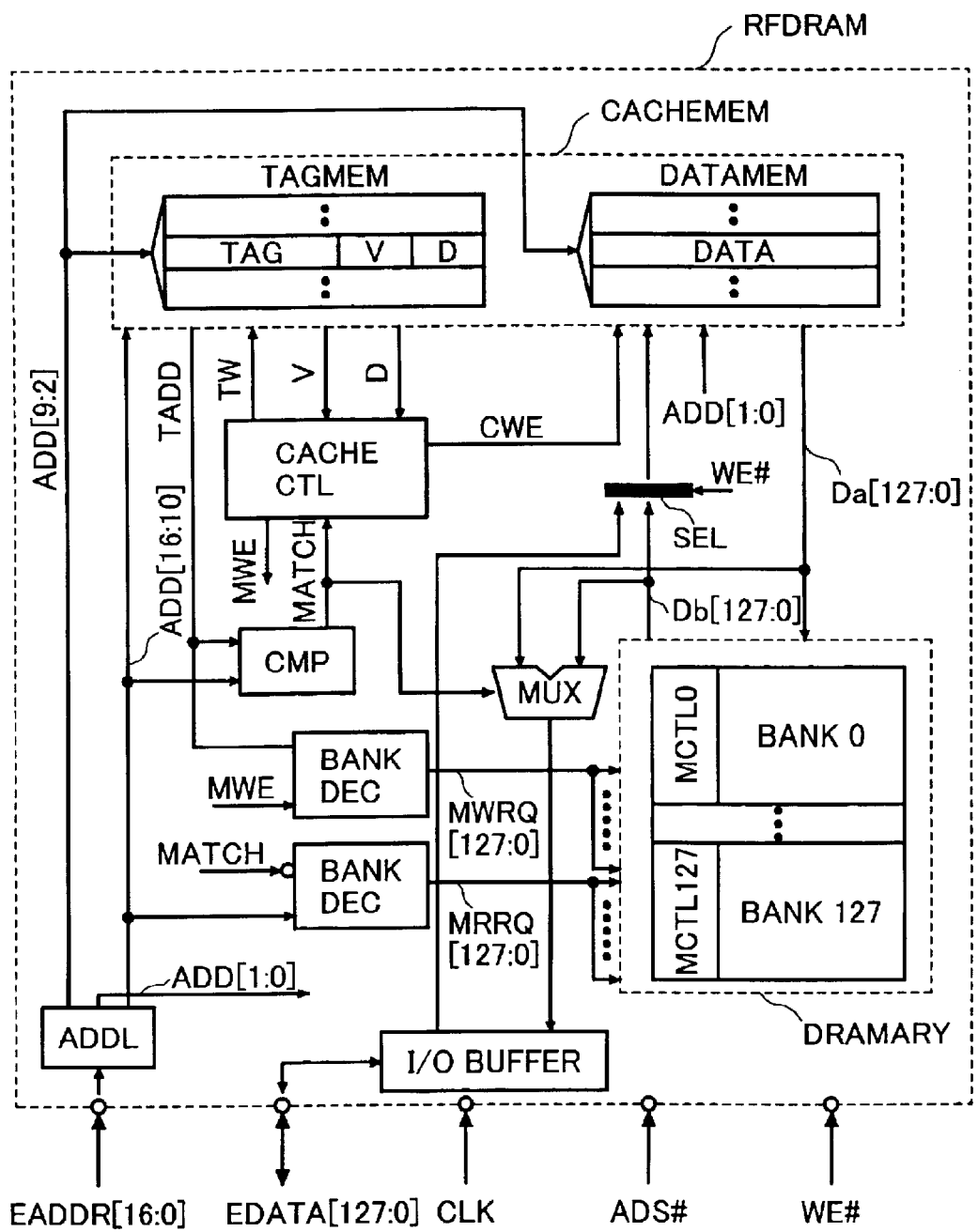
FIG. 6 is the second embodiment of the refresh free dynamic memory that hides refresh operations.

FIG. 6 shows the second embodiment of the RFDRAM of the present invention. The cache memory in this embodiment is controlled by the direct mapped caching scheme. The main difference from the first embodiment is that the external data bus EDATA[127:0] and the internal data bus Da[127:0]/Db[127:0] is equal in data width. In other words, the data width is the same among the data input/output to/from the DRAM array DRAMARY, the cache line, and the external data bus EDATA[127:0]. This configuration can eliminate dividing of a cache line into sub lines, so that the tag memory TAGMEM requires only a valid bit and a dirty bit. In addition, because the minimum unit of data management is equal to the data width of the cache line, the cache data control signal CDSIG[3:0] and the memory data control signal MDSIG[3:0] can be omitted. The address match signal MATCH is used instead of the data select signal DSEL that is inputted to the multiplexer MUX.

The memory operation in the second embodiment will be described. The basic operations of this second embodiment are the same as those of the first embodiment, so detailed description for them will be omitted here and only a read access cache miss and a write access cache miss will be described.

Read Access Cache Miss

If the upper address ADD[16:10] and the target tag address TAG differ from each other in an external input address or if the valid bit in the target sub line is reset, the cache controller CACHECTL decides it as a cache miss. If the dirty bit is reset in the target entry, the desired data is read from the DRAM array DRAMARY and output to the external data bus EDATA[127:0]. Data is fetched on write into the target entry.

If the dirty bit is set in the target sub line, data is written back in the target bank to keep the data coherence. In addition, the desired data is read from the DRAM array DRAMARY and output to the object. The output data is then fetched on write into the target entry.

A read access cache miss is processed as described above. In this embodiment, no cache line is divided into sub lines. Thus, there is no need to distinguish cache line data to be written back from any other data. Similarly, there is no need to distinguish cache line data to be fetched from other data in a fetch on write operation. When a read access is decided as a cache miss, all the banks other than a read-accessed bank and a written-back bank are idle, so that they can be refreshed. If a confliction occurs between an external access request and a refresh request, the memory controller as shown in FIGS. 4A and 4B can be used to process the external access first. The refresh operation can be executed later when the target bank is idle, of course.

Write Access Cache Miss

When addresses do not match in the address comparison between the upper address ADD[16:10] and the tag address TAG in the comparator CMP, the access is decided as a cache miss. If the dirty bit is reset in the target entry at this time, the external input data is written in the data memory DATAMEM, then the valid bit and the dirty bit of the entry are set. Because the data width of cache line data is the minimum unit of data management, no fetch on write from the DRAM array DRAMARY is required at a cache miss. Consequently, all the banks go into the idle state when the dirty bit is reset in the target entry, the banks can be refreshed.

When the dirty bit is set in the target sub line, the data in the sub line is already updated. The data is thus written back in the memory to keep the data coherence. At this time, the cache controller CACHECTL writes the external input data in the data memory DATAMEM and sets both of the valid bit and the dirty bit in the subject sub line. Because the data width is the same between the external data bus EDATA[127:0] and the cache line, there is no need to read/fetch on write data from the DRAM array DRAMARY. Consequently, all the banks other than a bank to be written back is idle, thereby they can be refreshed. The bank to be written back may be refreshed later when it goes into the idle state, of course. In addition, when a confliction occurs between a refresh operation and a write-back access, the memory controller as shown in FIGS. 4A and 4B can be used to process the external access first. The refresh operation can be executed later when the written-back bank is idle. The timing chart in this embodiment is the same as that shown in FIG. 5, so the description will be omitted here.

As described above, in this embodiment, there is no need to make a read access for a fetch on write operation from the DRAM array DRAMARY at the time of a write access cache miss. Consequently, consecutive accesses to the same bank in the DRAM array DRAMARY can be avoided. According to this embodiment, therefore, a bank can be driven into the idle state without fail so as to be refreshed. Thus this embodiment can realize a memory with excellent operability, causing no refresh operation to delay external accesses.

According to this embodiment, it is only required to equalize the data width among a plurality of memory banks, the cache lines, and the external data buses to realize a memory that can hide refresh operations from external easily.

Although some of such control signals as the clock CLK, the address strobe signal ADS#, the write enable signal WE#, etc. are omitted in the above embodiments so as to simplify the drawings, those signals may be inputted to object circuits so as to realize the controlling method as described above, of course. In addition, needless to say, the operation as shown in FIG. 5 can be realized by controlling the timing of each control signal and the memory controller MCTL just like in the first embodiment. Furthermore, just like in the first embodiment, the capacity of the cache memory, the line size, and the number of entries are not limited specially in this embodiment. Of course, the capacity of the DRAM array DRAMARY and the number of banks are not limited specially.

Third Embodiment

Figure 7:
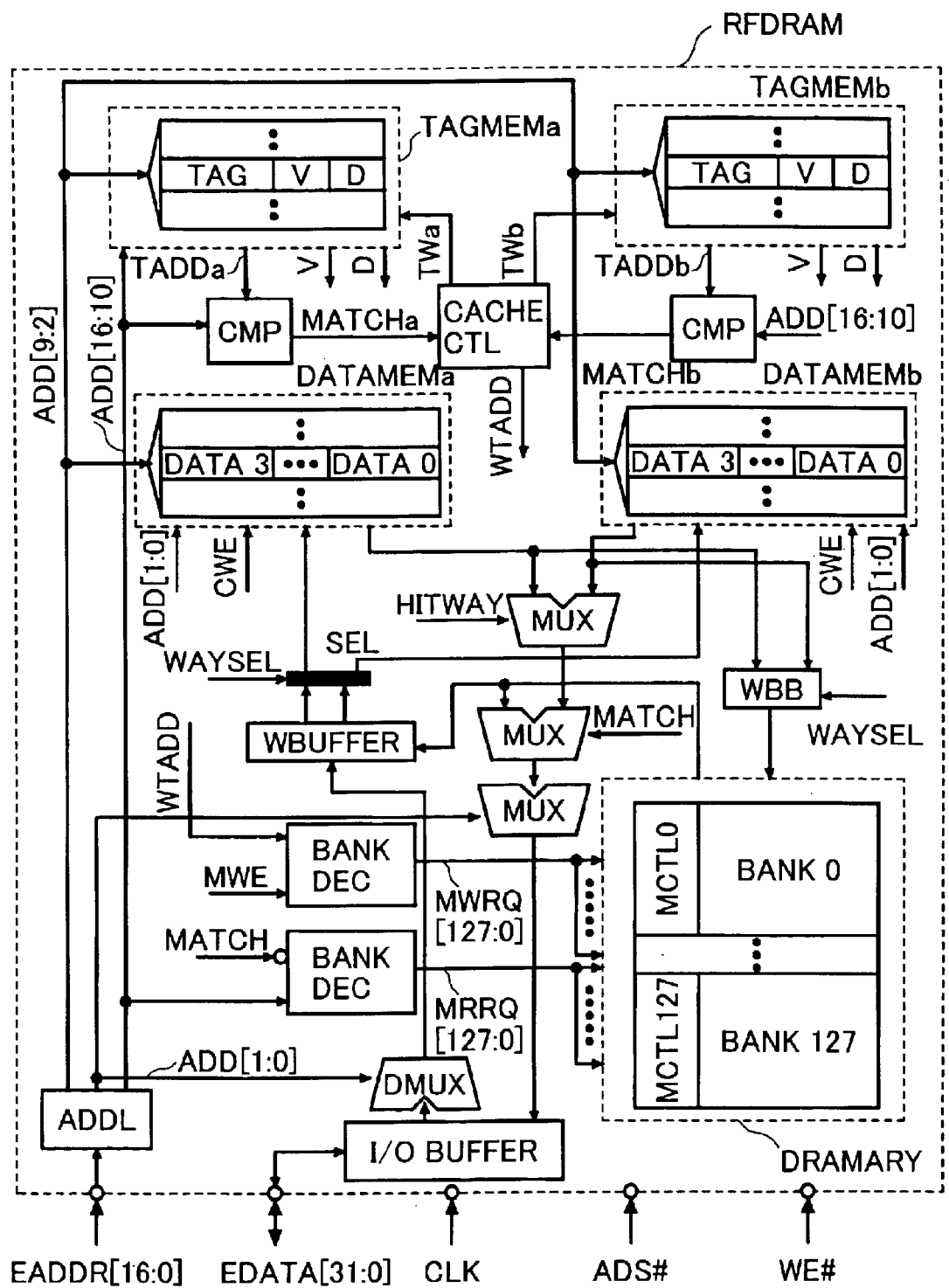
FIG. 7 is the third embodiment of the refresh free dynamic memory that hides refresh operations.

FIG. 7 shows the third embodiment of the RFDRAM of the present invention. The main difference from the first and second embodiments is that the cache memory CACHEMEM is composed of a plurality of tag memories TAGMEMa and TAGMEMb, as well as a plurality of data memories DATAMEMa and DATAMEMb and the set associative method is employed to control the cache memory CACHEMEM in this embodiment. The cache hit decision method in this embodiment also differs from that in other embodiments. In addition, the RFDRAM is provided with a write buffer WBUFFER, a write back buffer WBB, a hit way signal HITWAY, a way selector signal WAYSEL, and a write tag address bus WTADD, etc.

On the other hand, there in no need to divide a cache line into sub lines in this third embodiment, so that the cache data control signal CDSIG[3:0] and the memory data control signal MDSIG[3:0] are omitted just like in the second embodiment. Just like in the second embodiment, each cache line is provided with a valid bit and a dirty bit used to manage data.

The basic operations of this embodiment are the same as those of the first and second embodiments, so that the description for them except for a write access cache miss will be omitted here.

Write Access Cache Miss

In this embodiment, the cache memory CACHEMEM consists of a plurality of ways. In FIG. 7, the cache memory CACHEMEM is a two-way set associative memory. Each way capacity is equivalent to that of a bank. A way "a" consists of a tag memory TAGMEMa and a data memory DATAMEMa. A way "b" consists of a tag memory TAGMEMb and a data memory DATAMEMb. Each way has a comparator CMP. Receiving an address from an external address bus EADDR[16:0], the comparator CMP compares the address with the tag address of the referred entry. Each comparator CMP makes such a comparison between a referred tag address TAG and an external input address. When the addresses match, the comparator CMP drives the address match signal MATCHa or MATCHb high and inputs the signal to the cache controller CACHECTL. In this connection, it is assumed here that the requested data is not found in any way and the addresses do not match, that is, the access is decided as a cache miss. In this connection, the data in any of the two ways must be replaced. The algorithm for the data replacement may be, for example, LRU (Least Recently Used) one.

If the dirty bit is not set in the target cache line in which data is to be replaced, external input data is written in the requested way cache line. At this time, the data read from the DRAM array DRAMARY is inputted together with the external input data to the write buffer WBUFFER so as to keep the data coherency in the cache line. The cache controller CACHECTL outputs "0" as the way selector signal WAYSEL that represents that data replacement is to be done in the way "a". The "0" is then inputted to the selector SEL. Under the controlling, the external input data inputted to the write buffer WBUFFER and the data fetched from the DRAM array DRAMARY are inputted to the way "a" via the selector SEL, thereby the requested data is written in the requested cache line. The cache controller CACHECTL drives the tag write signal TWa high to write the upper address ADD[16:10] in the tag memory TAGMEMa.

When a dirty bit is set in the entry in which data replacement is to be done, the data in the entry must be written back. In other words, the cache controller CACHECTL reads the cache line data of the way "a" from the data memory DATAMEMa and writes the data in the write buffer WBB. At this time, the address of the bank in which data replacement is to be done is inputted to the bank decoder BANKDEC via the write address bus WTADD and the bank address is decoded there. The write-back buffer WBB receives "0" of the way select signal WAYSEL, which denotes that data replacement is to be done in the way "a". The data read from the data memory DATAMEMa is written back in the DRAM array DRAMARY. Under the controlling, data is written back. This completes the description for writing of both external inputted data and fetched data.

The processing of a write access cache miss is done as described above. In this embodiment, while a fetch on write operation from the DRAM array DRAMARY is required at the time of a cache miss, consecutive accesses to a bank can be avoided with use of a plurality of provided ways.

Figure 8:
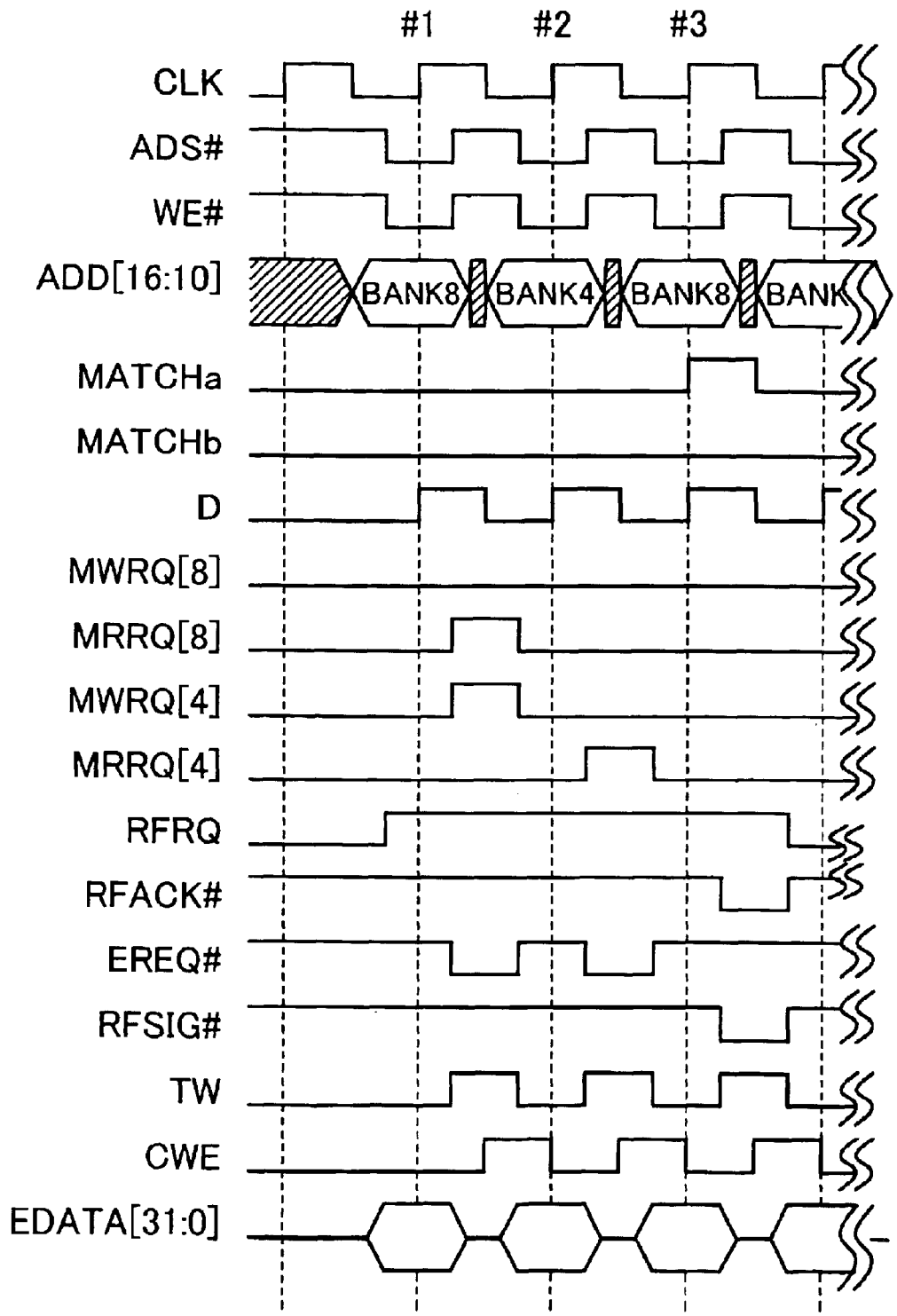
FIG. 8 is an operation waveform that denotes the conventional problem solved by the refresh memory free dynamic memory that uses the set associative cache memory shown in FIG. 7.

A description will be made for an external access and a refresh operation with reference to FIG. 8 that shows a timing chart of the operations in this embodiment. In FIG. 8, a write access is made at the timing of #1, which denotes that the requested data is not found in any of the two ways, thereby the access is decided as a cache miss. In addition, a refresh request is issued at the timing of #1. In this connection, a write-back access is requested to the bank 4, since the dirty bit is set in the cache line data in the way in which data replacement is to be made. Then, a read access is requested to the bank 8 so as to make a fetch on write operation. Consequently, the access to a bank is processed before the refresh operation. At the next timing #2, a write access is requested. Similarly, the requested data is not found in the accessed entry, thereby the access is decided as a cache miss. The bank 4 is thus accessed to read data therefrom so as to make a fetch on write operation. At this time, no write access is requested to the bank 8. This is because data replacement has just been done in the way "a" that stores the data of the bank 8, so that data replacement is to be done in another way "b" at the timing #2. Consequently, the read access to the bank 4 is processed before the refresh operation. It is assumed here that a write access is requested at the next timing #3. At this time, the data in the bank 8 already exists in the cache memory. Thus, the access is decided as a cache hit. Consequently, no access to the DRAM array DRAMARY is done. Of course, the bank address of the write access requested at the timing #3 is not 8, a write-back access to the bank 8 is done, but no access to the bank 4 is done. Accordingly the bank 4 can be refreshed.

As described above, because the cache memory in this embodiment is controlled by the set associative method that uses a plurality of tag memories and a plurality of data memories, consecutive accesses to the same bank can be avoided. In this embodiment, therefore, a bank can go into the idle state without fail, thereby the bank can be refreshed. Thus this embodiment can realize a memory with excellent operability without causing the refresh operation to delay external accesses.

According to this embodiment, refresh operations can be hidden from external even when the data width differs between the target cache line and the external data bus.

In the above embodiments, while some of such control signals as the clock CLK, the address strobe signal ADS#, the write enable signal WE#, etc. are omitted to simplify the drawings, they may be inputted to necessary circuits to realize the controlling method as described above, of course. In addition, the operations as shown in FIG. 8 can be realized by controlling the timings of respective control signals and the memory control MCTL just like in the first embodiment. Furthermore, in this embodiment, the capacity of the cache memory, the line size, the number of entries, and the number of ways are not limited specially. Of course, the capacity of the DRAM array DRAMARY and the number of banks in the configuration of this embodiment are not limited specially.

While no cache line is divided in the above embodiment, it is also possible to divide a cache line into sub lines and use the set associative method for controlling the cache memory just like in the first embodiment. For example, when it is assumed that the data width of the memory bank BANK0 is A, the number of divided sub lines of a cache line is N, and the external data bus width is C, the memory can be configured so as to satisfy A=N·C. It is possible to equalize the external data bus width A and the cache line data width B and use the set associative method to control the cache memory. Furthermore, other variations of the memory configuration are possible as long as no refresh operation causes external accesses to be delayed; for example, some or all the above controlling methods can be selected and combined to realize the controlling method.

In the above first to third embodiments, the write-back method has been used to control writing of data in the cache memory. The memory may also be realized by writing data in both of the cache memory and the DRAM array. In this connection, a write access is requested to the DRAM array even at the time of a cache hit and the access might conflict with a refresh operation sometimes. In such a case, for example, it is possible to instruct the cache controller to control so as to write data only in the cache memory. The data updated in the cache memory may be written back again at the time of a cache miss. Although this memory must be controlled so as to write external data in the DRAM array and detect whether or not a refresh operation is done in the DRAM array upon a request of external access, the configuration of the memory can be modified with use of the ordinary circuit technology to cope with the operations. The description for the modification will thus be omitted here.

In the first to third embodiments, the cache memory can be modified into a double structured one consisting of a DRAM having a plurality of banks and an SRAM cache memory having a capacity equal to that of one bank so as to reduce the area occupied by the memory. While a DRAM and an SRAM cache memory are combined in the above embodiments, the present invention is not limited only to those embodiments. Both of the DRAM and the SRAM may be replaced with other memory cells that are not required to be refreshed to realize a memory in which refresh operations can be hidden from external.

The RFDRAM in the first to third embodiments can be combined with another calculation circuit on one semiconductor chip. In this connection, the external data bus EDATA [31:0] means a data bus used to connect another calculation circuit to the RFDRAM and an external access means an access from another calculation circuit formed on the same semiconductor chip. The RFDRAM and another calculation circuit may also be formed on different semiconductor chips, of course. In this connection, the external data bus means a bus used to input/output data to/from the RFDRAM. For example, the external data bus means a bus used to connect a CPU to an RFDRAM in a computer.

The main effects of the present invention obtained in the above embodiments are as follows.

(1) The DRAM array can be driven into the idle state in which it is not accessed, since the DRAM array can be controlled such that an access-requested sub line is invalidated at the time of a write access cache miss and the fetching from the DRAM array can be omitted by dividing a cache line into sub lines and providing each of the sub lines with a valid bit and a dirty bit used to manage data. The memory controller can refresh the DRAM array in this idle state, thereby realizing a memory with excellent operability without causing the refresh operation in the DRAM array to delay any external access.

(2) Because the external data bus width and the data width of the cache line can be equalized, the fetching from the DRAM array can be omitted, thereby the DRAM array can be driven into the idle state in which the DRAM array is not accessed. In other words, a memory with excellent operability can be realized without causing the refresh operation in the DRAM array to delay external accesses.

(3) Because the set associative method is used to control the cache memory, it is possible to realize a memory with excellent operability without causing the refresh operation in the DRAM array to delay external accesses.

(4) DRAMs for memory cells and a few SRAMs are used to realize a memory that requires a smaller chip area than the six-transistor SRAM.

What is claimed is:

1. A semiconductor device, comprising:

a plurality of memory banks, each including a plurality of memory cells;

a cache memory that retains information read from said plurality of memory banks, the cache memory including a plurality of entries; and a plurality of data input/output nodes connected to an internal data bus connecting said plurality of memory banks to said cache as well as to an external data bus used to input/output information thereto/therefrom;

wherein each of said plurality of entries comprises a data part that stores information read from some of said plurality of memory banks, and a tag part that stores address information corresponding to the information stored in said data part;

said data part has a plurality of sub lines;

said tag part has a plurality of first flags used to denote whether or not information stored in said plurality of sub lines is valid and a plurality of second flags used to denote whether or not information stored in said plurality of sub lines should be written newly in said memory banks; and wherein A=N·B is satisfied where the number of said sub lines is N, the data width of said internal data bus is A, and the data width of said external data bus is B.

2. The semiconductor device according to claim 1, wherein said plurality of first flags are valid bits and said plurality of second flags are dirty bits.

3. The semiconductor device according to claim 1, wherein the number of said sub lines is identical to the number of said second flags.

4. The semiconductor device according to claim 1, wherein a data width of information stored in each of said plurality of sub lines is identical to a data width of said external data bus.

5. The semiconductor device according to claim 1, wherein said semiconductor device, when writing information read from said cache memory into said plurality of memory banks, writes information read from sub lines in which said plurality of corresponding dirty bits are valid into said plurality of memory banks, and suppresses writing of information stored in sub lines in which said plurality of corresponding dirty bits are invalid into said plurality of memory banks.

6. The semiconductor device according to claim 5,
wherein said semiconductor device, when writing information read from said plurality of memory banks into said plurality of sub lines, writes information into sub lines in which said plurality of corresponding dirty bits are invalid, and suppresses writing of said information into sub lines in which said plurality of corresponding dirty bits are valid.

7. The semiconductor device according to claim 1,
wherein said semiconductor device includes a dual port internal data bus disposed between each of said plurality of memory banks and said cache memory.

8. The semiconductor device according to claim 1,
wherein a direct mapped caching scheme is employed to control said cache memory.

9. The semiconductor device according to claim 1,
wherein said semiconductor device further comprises a memory control circuit used to control refresh operations in said plurality of memory banks; and
wherein said memory control circuit, when one of said plurality of memory banks receives both of an external access request and a refresh request concurrently, gives priority to execution of said external access request over said refresh request.

10. The semiconductor device according to claim 1,
wherein each of said plurality of memory banks comprises DRAM memory cells and said cache memory comprises SRAM memory cells.

11. A semiconductor device, comprising:

a plurality of memory banks, each including a plurality of memory cells;

first and second cache memories used to retain information read from said plurality of memory banks;

a plurality of input/output nodes connected to an external data bus used to input/output information to/from said first and second cache memories;

a first comparator corresponding to said first cache memory; and a second comparator corresponding to said second cache memory; wherein said first cache memory includes a plurality of first entries;

said second cache memory includes a plurality of second entries; and each of said plurality of first entries has a first data part used to store information read from some of said plurality of memory banks, and a first tag part used to store address information corresponding to the information stored in said first data part;

each of said plurality of second entries has a second data part used to store information read from some of said plurality of memory banks and a second tag part used to store address information corresponding to the information stored in said second data part;

said first comparator compares an external address with address information stored in a corresponding first tag part;

said second comparator compares said external address with address information stored in a corresponding second tag part;

said plurality of memory banks input/output information in units of a data width A;

said first and second data parts store information in units of a data width B, which is equal to said data width A;

said first data part is divided into N first cache lines;

said second data part is divided into N second cache lines; and $A = N \cdot C$ is satisfied where a data width of said external data bus is C.

12. The semiconductor device according to claim 11,
wherein a set associative method is used to control said first and second cache memories.

13. The semiconductor device according to claim 11,
wherein said semiconductor device further comprises a memory control circuit used to control refresh operations in said plurality of memory banks; and
wherein said memory control circuit, when one of said plurality of memory banks receives both of an external access request and a refresh operation request concurrently, gives priority to execution of said external access request over said refresh operation request.

* * * * *